United States Patent
Nakamura et al.

(10) Patent No.: US 6,395,993 B1
(45) Date of Patent: May 28, 2002

(54) MULTILAYER FLEXIBLE WIRING BOARDS

(75) Inventors: Masayuki Nakamura; Mitsuhiro Fukuda, both of Tochigi (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/671,260

(22) Filed: Sep. 28, 2000

(30) Foreign Application Priority Data

Oct. 1, 1999 (JP) ............................................. 11-281017

(51) Int. Cl.⁷ ............................... H05K 1/00; H05K 1/03
(52) U.S. Cl. ........................ 174/254; 174/255; 174/256; 174/258; 174/259; 361/749; 361/750; 361/751; 361/767; 361/779; 361/792; 439/67
(58) Field of Search .................................. 174/254, 255, 174/256, 259, 261, 267, 257, 258; 361/749, 750, 751, 792, 767, 777, 793, 795, 779, 789, 803; 439/65, 66, 67, 70, 71, 74

(56) References Cited

U.S. PATENT DOCUMENTS

| | | | |
|---|---|---|---|
| 3,778,530 A | * 12/1973 | Reimann | 174/261 |
| 3,781,596 A | * 12/1973 | Galli et al. | 361/751 |
| 4,237,607 A | * 12/1980 | Ohno | 29/840 |
| 5,296,649 A | * 3/1994 | Kosuga et al. | 174/250 |
| 5,342,207 A | * 8/1994 | Sobhani | 439/74 |
| 5,374,469 A | 12/1994 | Hino et al. | |
| 5,468,917 A | * 11/1995 | Brodsky et al. | 174/255 |
| 5,493,074 A | * 2/1996 | Murata et al. | 174/254 |
| 6,225,569 B1 | * 5/2001 | Hashimoto et al. | 174/260 |
| 6,233,821 B1 | * 5/2001 | Takahashi et al. | 29/847 |
| 6,242,103 B1 | * 6/2001 | Farnworth | 428/458 |
| 6,280,828 B1 | * 8/2001 | Nakatsuka et al. | 428/209 |

FOREIGN PATENT DOCUMENTS

| | | |
|---|---|---|
| JP | A 52-73381 | 6/1977 |
| JP | A 4-010696 | 1/1992 |
| JP | A 5-152755 | 6/1993 |
| JP | A 8-213729 | 8/1996 |

OTHER PUBLICATIONS

Mar. 21, 2001 Notification of Reasons for Refusal from Japanese Patent Office.

* cited by examiner

*Primary Examiner*—Kamand Cuneo
*Assistant Examiner*—I B Patel
(74) *Attorney, Agent, or Firm*—Oliff Berridge, PLC

(57) ABSTRACT

The present invention aims to manufacture a reliable multilayer flexible wiring board at high yield.

Flexible wiring board 10 used for multilayer flexible wiring board 40 of the present invention has metal coating 14 on the surface of metal wiring film 19, and metal coating 14 is exposed within the contact region. A wall member rising above the surface of metal coating 14 is provided around the exposed metal coating 14. The wall member is formed of wall face 23 of opening 17 in resin film 15 at the top of metal wiring film 19, for example. When bump 34 having low-melting metal coating 36 is contacted with metal coating 14 in said contact region and heated above the melting point of the solder metal under pressure, low-melting metal coating 36 melts. The molten low-melting metal is stopped by wall face 23 from overflowing outside the contact region so that any bridge cannot be formed by the solder metal between metal wiring film 19.

13 Claims, 7 Drawing Sheets

PRIOR ART

Fig.8b

PRIOR ART

Fig.9a

PRIOR ART

Fig.9b

PRIOR ART

Fig.9c

PRIOR ART

MULTILAYER FLEXIBLE WIRING BOARDS

FIELD OF THE INVENTION

The present invention relates to the field of flexible wiring boards, particularly to the technique of laminating single-layer flexible wiring boards to form a multilayer flexible wiring board of laminated structure.

PRIOR ART

Recently, multilayer flexible wiring boards are widely used in the field of electronic apparatus.

A method for obtaining a multilayer flexible wiring board involves laminating a plurality of single-layer wiring boards.

In order to laminate single-layer wiring boards to form a multilayer flexible wiring board, we began by preparing first and second flexible wiring boards 110, 120 as described below on trial.

Figure 8A:
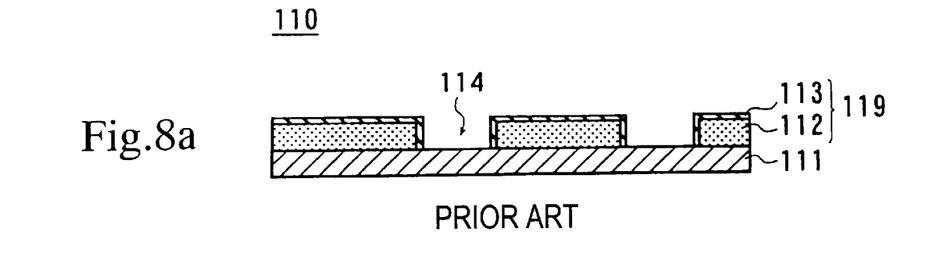
FIGS. 8(a),(b) shows one of the example for a single-layer flexible wiring board used for lamination.

Referring to FIG. 8(*a*), first flexible wiring board 110 has a first base film 111, on which a first conductive film 112 is formed by patterning a copper foil.

A gold coating 113 is formed on the surface of first conductive film 112 so that gold coating 113 and first conductive film 112 form a first wiring film 119. A plurality of such first wiring films 119 are formed.

The reference 114 in FIG. 8(*a*) represents an opening region including an opening or space located between first wiring films 119, which are insulated from each other by said opening region 114. First base film 111 is exposed at the bottom of opening region 114.

Figure 8B:
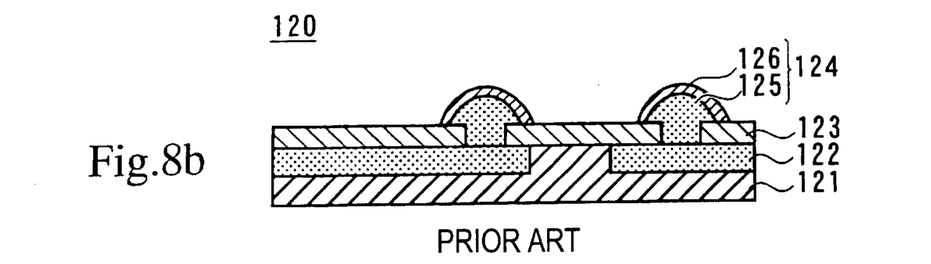

The reference 120 in FIG. 8(*b*) represents a second flexible wiring board to be laminated to said first flexible wiring board 110.

This second flexible wiring board 120 has a second base film 121, on which a second conductive film 122 is formed by patterning a copper foil. A resin film 123 including a thermoplastic resin having insulating properties is formed on the surface of second conductive film 122, and a metal projection 125 is mounted on second conductive film 122 with the top projecting from the surface of resin film 123.

A low-melting metal coating 126 including solder is formed on the surface of metal projection 125 so that low-melting metal coating 126 and metal projection 125 form a bump 124.

Figure 9A:
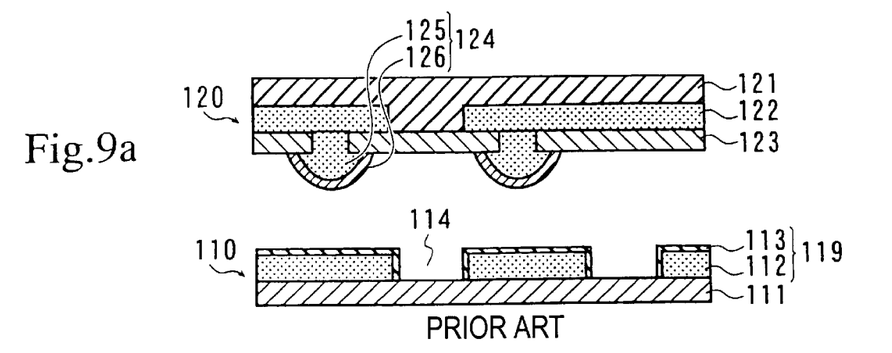
FIGS. 9(a)–(c) shows one of the example of a process for manufacturing a multilayer flexible wiring board.

For laminating said first and second flexible wiring boards 110, 120, these flexible wiring boards are first arranged in such a manner that first conductive film 112 of first flexible wiring board 110 and bump 124 on second flexible wiring board 120 face each other (FIG. 9(*a*)).

Figure 9B:
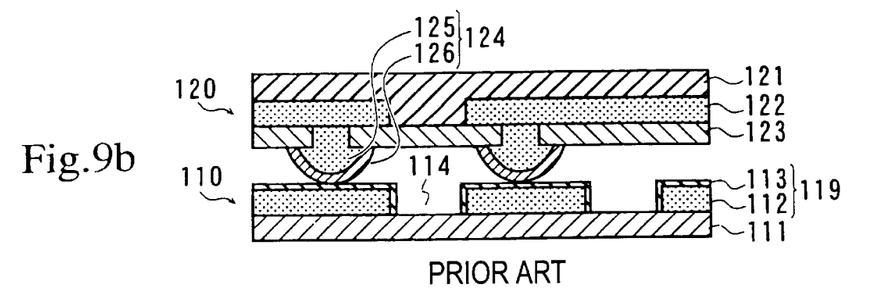

Then, gold coating 113 on first conductive film 112 and low-melting metal coating 126 on bump 124 are contacted with each other (FIG. 9(*b*)) and heated under pressure until low-melting metal coating 126 melts. Then, low-melting metal (solder in this example) is cooled to solidify to connect first conductive film 112 and bump 24.

Figure 9C:
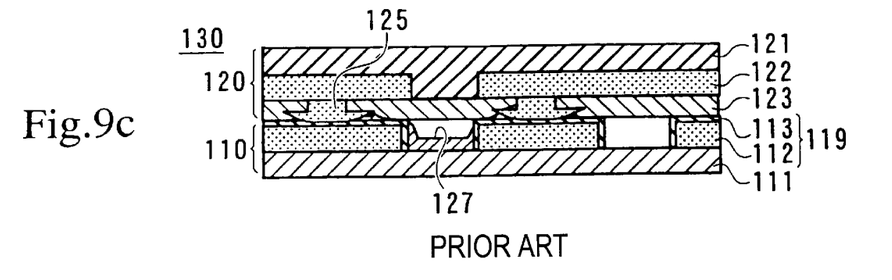

Thermoplastic resins soften to develop adhesiveness upon eating. Resin film 123 softens as low-melting metal coating 126 melts, and then it is cooled to bond two flexible wiring boards 110, 120 via resin film 123. As a result, first and second conductive films 112, 122 are electrically connected via bump 124 into a multilayer flexible wiring board 130 (FIG. 9(*c*)).

However, there is a demand for reducing the space between wiring films of flexible wiring boards to be heih-density.

In case of multilayer flexible wiring board 130 having the structure described above, low-melting metal coating 126 melts under pressure to sometimes fly about.

If the space between first wiring films 119 or between second conductive films 122 is narrow, the flying low-melting metal may form a bridge 127 to invite short circuit. In FIG. 9(*c*), the resulting bridge 127 causes short circuit between first wiring films 119.

An object of the present invention is to provide a technique for laminating flexible wiring boards at high yield to overcome the disadvantages of the prior art described above.

SUMMARY OF THE INVENTION

In order to attain the above object, the present invention provides a multilayer flexible wiring board comprising laminated first and second flexible wiring boards, said first flexible wiring board comprising a first base film, a first wiring film having a first conductive film applied on said first base film and patterned, a contact pad including the part of said first wiring film exposed at the surface, and a wall member provided around said contact pad and rising above the top of said contact pad, and said second flexible wiring board comprising a second base film, a second wiring film having a second conductive film applied on said second base film and patterned, and a plurality of bumps connected to said second wiring film and exposed at the top, wherein a low-melting metal coating is formed on either of the surface of the part of said first conductive film forming said contact pad or the surface of at least the top of said bump, and said low-melting metal coating melts under heat and then solidifies to connect said contact pad and said bump.

In the multilayer flexible wiring board of the present invention, said low-melting metal may be an alloy based on lead and tin.

In the multilayer flexible wiring board of the present invention, said low-melting metal may be an alloy based on tin and gold but not including lead.

In the multilayer flexible wiring board of the present invention, a highly wetting metal coating including a metal or alloy being wetter than copper with said low-melting metal coating, may be formed on the surface of the part of said metal film forming said contact pad or the surface of at least the top of said bump on which said low-melting metal coating is not formed.

In the multilayer flexible wiring board of the present invention, said highly wetting metal coating may be any of a gold coating based on gold, a platinum coating based on platinum, a silver coating based on silver, a nickel coating based on nickel, a copper-nickel alloy coating or a solder coating.

In the multilayer flexible wiring board of the present invention, the height of said wall member above the top of said contact pad may be 5 $\mu$m or more.

In the multilayer flexible wiring board of the present invention, a first resin film is provided on said first wiring film and an opening is provided in said first resin film at the top of said contact pad so that said wall member includes said first resin film forming the inner circumferential face of said opening.

In the multilayer flexible wiring board of the present invention, said first resin film has the property of developing adhesiveness upon heating so that said first flexible wiring board and said second flexible wiring board are bonded together via said first resin film.

Said opening of the multilayer flexible wiring board of the present invention has such a volume that said low-melting metal coating does not overflow outside said opening when said low-melting metal coating is molten while said bump is in contact with said contact pad.

Said opening of the multilayer flexible wiring board of the present invention has such shape and area that said bump can come into contact with said contact pad without touching said wall member.

The height of the projecting part of said bump of the multilayer flexible wiring board of the present invention is larger than the height of said wall member from the top of said contact pad.

Said second flexible wiring board of the multilayer flexible wiring board of the present invention has at least a second resin film provided on at least said second wiring film and the top of said bump projects from said second resin film.

Said second resin film of the multilayer flexible wiring board of the present invention has the property of developing adhesiveness upon heating so that said first flexible wiring board and said second flexible wiring board are bonded together via said second resin film.

The multilayer flexible wiring board of the present invention has the structure described above, comprising first and second wiring films wherein a low-melting metal coating is formed on at least one of the surface of the contact pad at the top of the first wiring film or the surface of the bump. A wall member rising above the top of the contact pad is provided around the first wiring film exposed at the top of the contact pad.

When the first and second flexible wiring boards are superposed and heated while the top of the bump is in contact with the top of the contact pad, the low-melting metal coating melts but the melt of the low-melting metal coating is stopped by the wall member from flowing out. Therefore, no short circuit occurs between adjacent wiring films.

The height of the wall member from the top of the contact pad is preferably 5 $\mu$m ($5 \times 10^{-6}$ m) or more.

Considering that wiring films are generally made from copper, the multilayer flexible wiring board of the present invention has a highly wetting metal coating being wetter than copper with the low-melting metal coating on the surface of the contact pad or the surface the bump on which the low-melting metal coating is not formed. Specifically, such a highly wetting metal coating may be a metal coating based on gold, a metal coating based on silver, a metal coating based on nickel, a solder coating, a copper-nickel alloy coating, etc.

When the first and second flexible wiring boards are heated to allow the low-melting metal coating to melt, the melt spreads over the surface of the highly wetting metal coating and then solidifies to firmly connect the bump and wiring films.

The wall member of the present invention may be provided at the top of the contact pad or a location apart from the contact pad such as at the top of the base film. The wall member should desirably have a structure surrounding the contact pad.

The first and second flexible wiring board, and the multilayer flexible wiring board of the present invention have property of flexibility.

DETAILED DESCRIPTION OF THE INVENTION

Figure 1A:
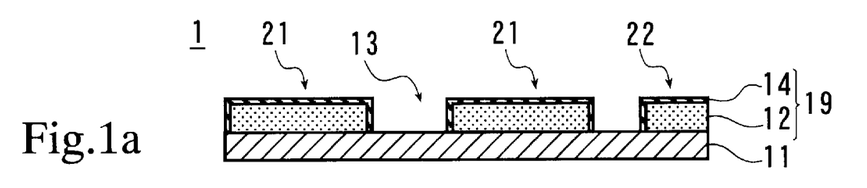
FIGS. 1(a)–(e) shows a process for manufacturing a single-layer flexible wiring board used in the present invention.

The reference 1 in FIG. 1(a) represents a substrate constituting a material for a multilayer flexible wiring board of the present invention.

This substrate 1 has a first base film 11 and a first conductive film 12 applied on said first base film 11.

First conductive film 12 includes a copper foil applied on first base film 11 and patterned in a predetermined configuration via photolithography and etching. A high wetting metal coating 14 based on gold is formed by plating on the top and side faces of first conductive film 12. Highly wetting metal coating 14 and first conductive film 12 form a first wiring film 19. A plurality of such first wiring films 19 are formed.

First conductive film 12 has a relatively large-area patterned part and a narrow patterned part. First wiring film 19 also has a large-area part and a narrow part in conformity with the configuration of first conductive film 12.

Figure 2A:
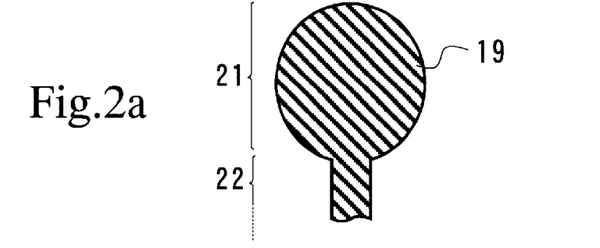
FIGS. 2(a)–(c) is a plan view showing the geometric relation between the opening in the resin film and the contact region of the metal wiring in the single-layer flexible wiring board shown in FIG. 1.

The large-area patterned part here is circular as shown in FIG. 2(a) and forms a contact pad 21 by first wiring film 19 in this part.

The narrow part of first wiring film 19 forms a lead part 22. Lead part 22 is connected to contact pad 21.

The reference 13 in FIG. 1(a) represents an opening region including an opening or space between first wiring films 19. First base film 11 is exposed at the bottom of opening region 13.

A process for manufacturing a multilayer flexible wiring board of the present invention using this substrate 1 is described below.

Figure 1B:
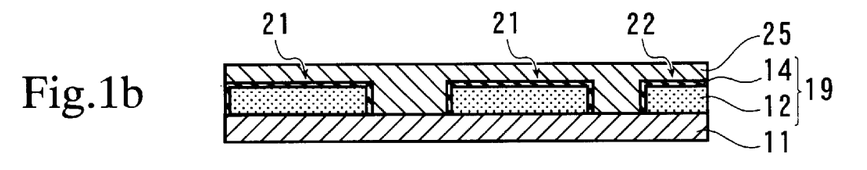

A polyimide varnish including a polyimide precursor is applied on the surface of substrate 1 on which first wiring film 19 is formed. Thus applied polyimide varnish not only covers first wiring film 19 but also flows into opening region 13 between first wiring films 19 to cover first metal wiring film 19 and opening region 13. It is dried as such to form a polyimide precursor layer 25 having a flat surface (FIG. 1(b)).

Figure 1C:
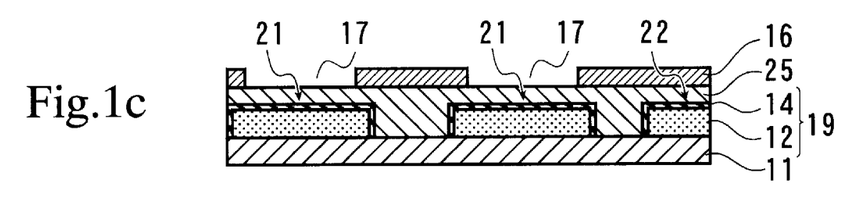

Then, a photosensitive resin film 16 patterned by exposure and development is formed on polyimide precursor layer 25 (FIG. 1(c)). The reference 17 in FIG. 1(c) represents an opening in photosensitive resin film 16. Polyimide precursor layer 25 is exposed at the bottom of this opening 17. Opening 17 here is circular and provided at the top of contact pad 21 of first wiring film 19.

Figure 2B:
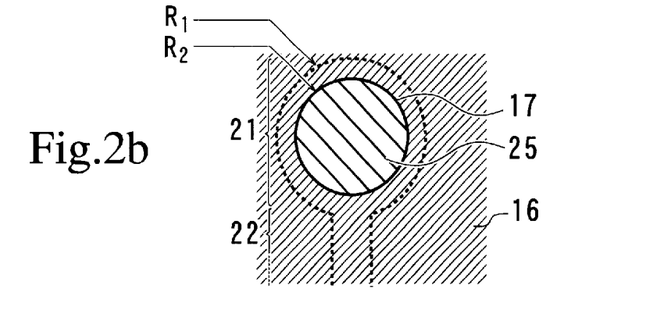

The geometric relation between opening 17 and contact pad 21 is shown in FIG. 2(b). The diameter $R_2$ of opening 17 is smaller than the diameter $R_1$ of contact pad 21, and photosensitive resin film 16 is provided on the edge of contact pad 21.

Figure 1D:
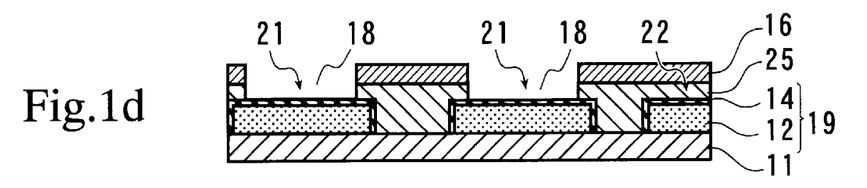

When the assembly as shown in FIG. 1(c) is immersed in an alkali solution, polyimide precursor layer 25 at the bottom of opening 17 is removed by etching to form an opening 18 having a diameter approximately equal to that of opening 17 of photosensitive resin film 16 on polyimide precursor layer 25 (FIG. 1(d)). Highly wetting metal coating 14 of first wiring film 19 is exposed at the bottom of opening 18.

Opening 18 has a diameter smaller than that of contact pad 21 and is nearly concentric with contact pad 21 so that polyimide precursor layer 25 exists on the edge of first wiring film 19 forming contact pad 21.

After opening 18 is formed, photosensitive resin film 16 is removed. Then, substrate 1 is heat-treated to cure polyimide precursor layer, whereby a first resin film 15 including a non-thermoplastic polyimide film is formed to give a first flexible wiring board 10 (FIG. 1(e)).

Figure 1E:
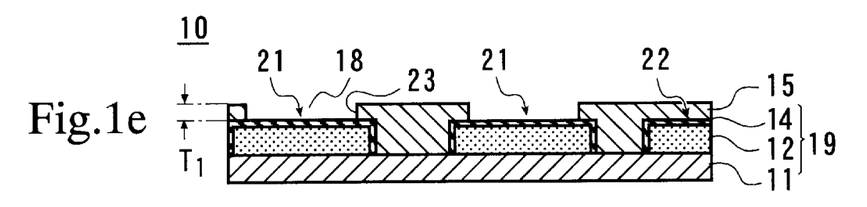

As polyimide precursor layer 25 is heat-treated to form first resin film 15, first resin film 15 is firmly bonded to the surface of first base film 11 and the surface of highly wetting metal coating 14 of first wiring film 19.

Figure 2C:
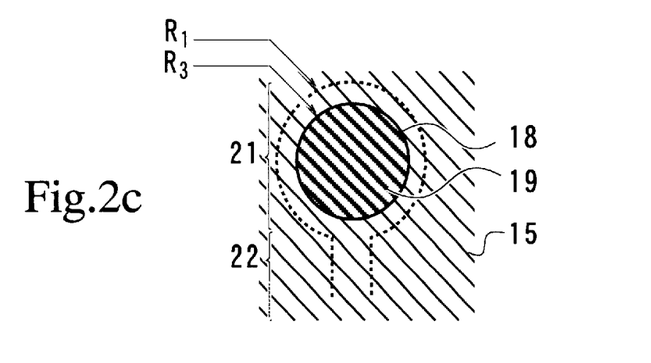

The geometric relation between opening 18 in first resin film 15 and contact pad 21 is shown in FIG. 2(c). The diameter $R_3$ of opening 18 is smaller than the diameter $R_1$ of contact pad 21, and first resin film 15 exists on the edge of contact pad 21. Thus, the exposed part of first wiring film 19 forming contact pad 21 is surrounded by wall face 23 of first resin film 15. All of a plurality of contact pads 21 have such a structure.

On the other hand, a plurality of narrow leads 22 on first base film 11 are covered with first resin film 15 all over the surfaces. Thus, the surface of first wiring film 19 forming lead part 22 is not exposed.

Figure 3:
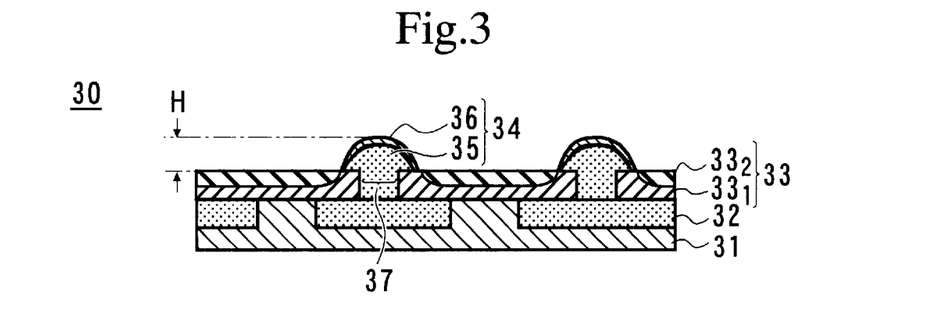
FIG. 3 shows a single-layer flexible wiring board to be laminated to the single-layer flexible wiring board shown in FIG. 1.

Now referring to FIG. 3, the reference 30 represents a second flexible wiring board.

This second flexible wiring board 30 has a second base film 31, a second conductive film 32, a second resin film 33 and a plurality of bumps 34 (only two are shown in the drawing).

Second conductive film 32 is patterned in a predetermined configuration and provided on base film 31. In this second flexible wiring board 30, second conductive film 32 forms a second wiring film.

Second resin film 33 is provided on the surface of second conductive film 32. A plurality of openings 37 are formed in this second resin film 33. Bump 34 is provided within each opening 37.

Bump 34 comprises a metal projection 35 and a low-melting metal coating 36 formed on the surface of the top of the projection. Metal projection 35 is formed of copper partially grown by plating and connected to second conductive film 32 at the bottom. On the other hand, the top of metal projection 35 projects from the surface of second resin film 33.

A solder coating is formed by plating on the surface of the top of metal projection 35 projecting from the surface of second resin film 33, whereby this solder coating forms low-melting metal coating 36.

Second resin film 33 has a laminated structure of a thermosetting resin film $33_1$ and a thermoplastic resin film $33_2$.

Thermosetting resin film $33_1$ covers the surface of second conductive film 32 and the surface of second base film 31 between second conductive films 32, while thermoplastic resin film $33_2$ covers the surface of thermosetting resin film $33_1$. The top of bump 34 projects from the surface of thermoplastic resin film $33_2$. Thermoplastic resin film $33_2$ has the property of softening to develop adhesiveness at high temperatures but not normal temperatures.

The solder forming low-melting metal coating 36 includes a tin/zinc-based alloy having a melting point of 189° C. Low-melting metal coating 36 desirably has a definite thickness within the range from 3 $\mu$m to 15 $\mu$m.

A process for connecting first and second flexible wiring boards 10, 30 described above is set forth below.

Figure 4A:
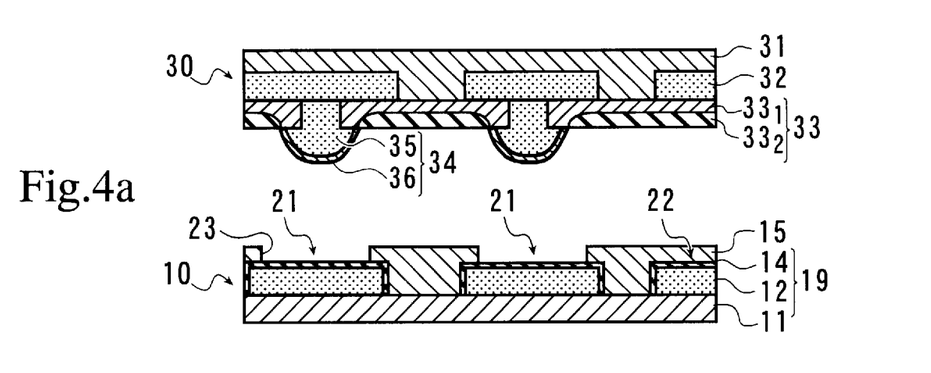
FIGS. 4(a)–(c) shows a process for manufacturing a multilayer flexible wiring board according to the present invention.

First and second flexible wiring boards 10, 30 are first arranged in such a manner that contact pad 21 and bump 34 face each other (FIG. 4(a)).

A plurality of contact pads 21 and a plurality of bumps 34 of first and second flexible wiring boards 10, 30 are provided at locations that allow them to come into contact with each other when first and second flexible wiring boards 10, 30 are superposed with contact pads 21 and bumps 34 facing each other.

Figure 4B:
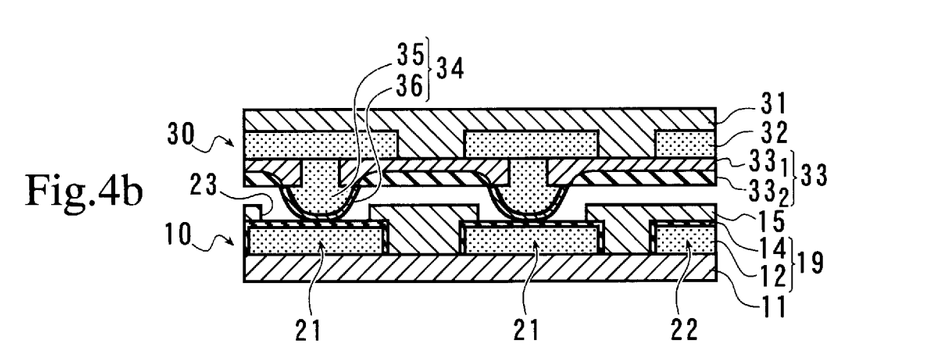

FIG. 4(b) shows that first and second flexible wiring boards 10, 30 are superposed.

The reference H in FIG. 3 represents the height of the top of bump 34 from the surface of second resin film 33. The reference $T_1$ in FIG. 1(e) represents the height of first resin film 15 from the surface of first wiring film 19. The height H of bump 34 is greater than the height $T_1$ of first resin film 15. Thus, the top of bump 34 comes into contact with the top of contact pad 21 when first and second flexible wiring boards 10, 30 are pressed against each other (FIG. 4(b)).

When either or both of first and second flexible wiring boards 10, 30 are heated to 200° C. under pressure as such, low-melting metal coating 36 melts.

Low-melting metal coating 36 spreads over first wiring film 19 forming contact pad 21 because highly wetting metal coating 14 formed on the surface of first wiring film 19 includes a metal or alloy being wetter than copper with the melt of low-melting metal coating 36.

A container having an inner circumferential face including wall face 23 of first resin film 15 and a bottom including first wiring film 19 is formed on contact pad 21, so that the melt of low-melting metal coating 36 spreading over first wiring film 19 is stopped by wall face 23 from overflowing. Thus, the melt of low-melting metal coating 36 cannot invite any short circuit between contact pads.

Second resin film 33 is heated up with low-melting metal coating 36. The resin for thermoplastic resin film $33_2$ here includes a thermoplastic polyimide having a softening temperature lower than the melting temperature of low-melting metal coating 36, whereby thermoplastic resin film $33_2$ softens to develop adhesiveness before low-melting metal coating 36 melts.

However, thermoplastic resin film $33_2$ may include a thermoplastic resin having a softening temperature higher than the melting temperature of low-melting metal coating 36 by the choice of the type of polyimide.

The thickness of thermoplastic resin film $33_2$ is thinner than the thickness of thermosetting resin film $33_1$, so that thermoplastic resin film 33 cannot flow out even when low-melting metal coating 36 is heated to the melting temperature.

The melt of low-melting metal coating 36 solidifies when it is cooled after heat treatment for 30 seconds, whereby metal projection 35 and contact pad 21 are electrically and mechanically connected. The reference 29 in FIG. 4(c) represents the state of the melt of low-melting metal coating 36 after solidification.

Figure 4C:
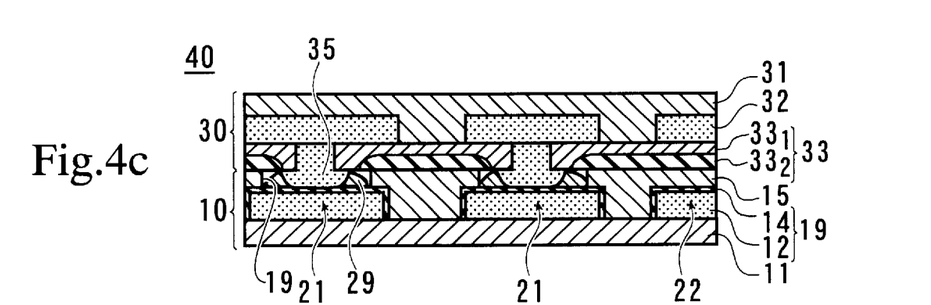

When second resin film 33 is cooled, two flexible wiring boards 10, 30 are bonded together via cooled thermoplastic resin film $33_2$ into a multilayer flexible wiring board 40 shown in FIG. 4(c).

A high-temperature storage test was performed on multilayer flexible wiring board 40 obtained by the process described above. After storage at 150° C. for 1000 hours, connection resistance between first and second flexible wiring boards 10, 30 was measured.

Test samples were two type of multilayer flexible wiring boards 40 prepared with second flexible wiring boards 30 in which the part of bump 34 projecting from second resin film 33 has a diameter of 150 μm or 100 μm.

Contact pad 21 on first flexible wiring board 10 to be contacted with bump 34 had a diameter of 250 μm or 100 μm.

As comparisons, multilayer flexible wiring boards were prepared with flexible wiring boards lacking solder coating on the surface of bumps and placed under high-temperature storage conditions at 150° C. for 1000 hours.

Connection resistance was measured before and after storage on comparative multilayer flexible wiring boards as well as multilayer flexible wiring boards 40 according to the present invention.

The measurement results are shown in Table 1 below.

TABLE 1

High-temperature storage test of flexible wiring boards

| | Example | | | | Comparative example | |
|---|---|---|---|---|---|---|
| Connection means | Solder | Solder | Solder | Solder | No solder | No solder |
| Bump Diamater (μm) | 150 | 100 | 100 | 100 | 150 | 50 |
| Contact region diameter (μm) | 250 | 250 | 200 | 100 | 250 | 100 |
| Connection resistance before storage (Ω) | 0.5 | 0.5 | 0.5 | 0.5 | 0.5 | 0.5 |
| Connection resistance after storage (Ω) | 0.5 | 0.5 | 0.5 | 0.5 | ∞ (Open) | ∞ (Open) |

Table 1 shows that electric connection is stably maintained in multilayer flexible wiring boards 40 according to the present invention with no change in connection resistance after high-temperature storage.

However, connection resistance became indefinite in comparative flexible wiring boards, which means that they are less reliable than multilayer flexible wiring boards according to the present invention.

Although multilayer flexible wiring board 40 in the foregoing example was prepared by thermocompression bonding first flexible wiring board 10 having highly wetting metal coating 14 and second flexible wiring board 30 having low-melting metal coating 36, multilayer flexible wiring board 40 of the present invention is not limited to such an embodiment.

Figure 5A:
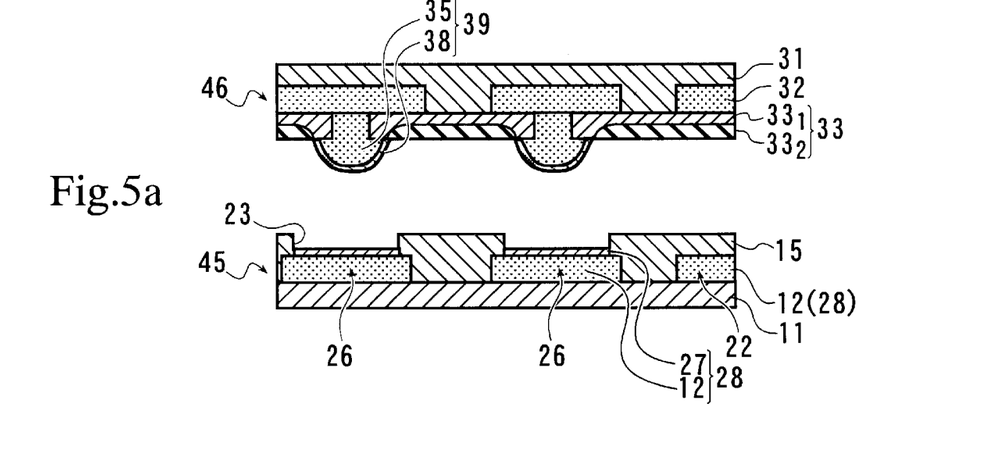
FIGS. 5(a)–(c) shows a process for manufacturing another example of multilayer flexible wiring board according to the present invention.

The references 45, 46 in FIG. 5(a) represent first and second flexible wiring boards having a different structure from the foregoing, while the same elements as those of first and second flexible wiring boards 10, 30 in the foregoing example are indicated by the same references.

This first flexible wiring board 45 has a first base film 11. A first conductive film 12 including a patterned copper foil is provided on base film 11. A first resin film 15 is provided on first conductive film 12.

First conductive film 12 has a narrow part and a wide part, and an opening is formed in first resin film 15 at the top of the wide part of first conductive film 12.

A low-melting metal coating 27 such as solder is formed on the surface of first conductive film 12 at the bottom of the opening, so that a contact pad 26 is formed of the wide part of first conductive film 12 and low-melting metal coating 27 on the surface of said part.

On the other hand, second flexible wiring board 46 comprises a second base film 31 and a second conductive film 32 comprises a patterned copper foil on the surface of second base film 31. A second resin film 33 capable of developing adhesiveness upon heating is provided on the surface of second conductive film 32 and on the surface of second base film 31.

A metal projection 35 is mounted on second conductive film 32 with the top projecting from second resin film 33. A highly wetting metal coating 38 being wetter than copper with low-melting metal coating 27 on first flexible wiring board 45 is formed on the surface of metal projection 35. A bump 39 is formed of highly wetting metal coating 38 and metal projection 35.

Figure 5B:
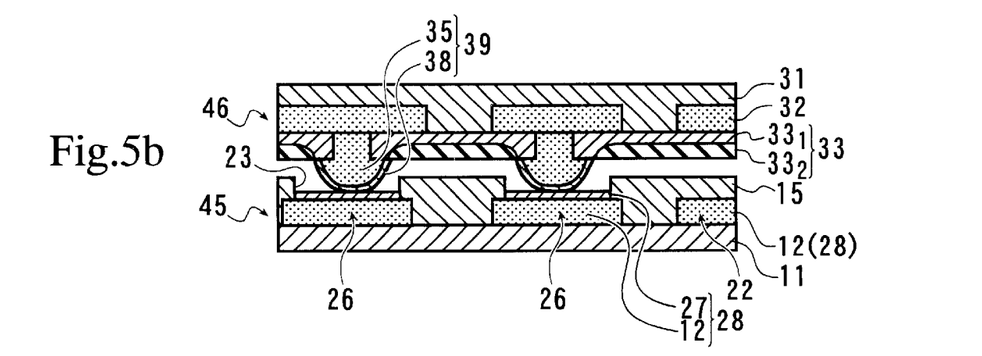
Figure 5C:
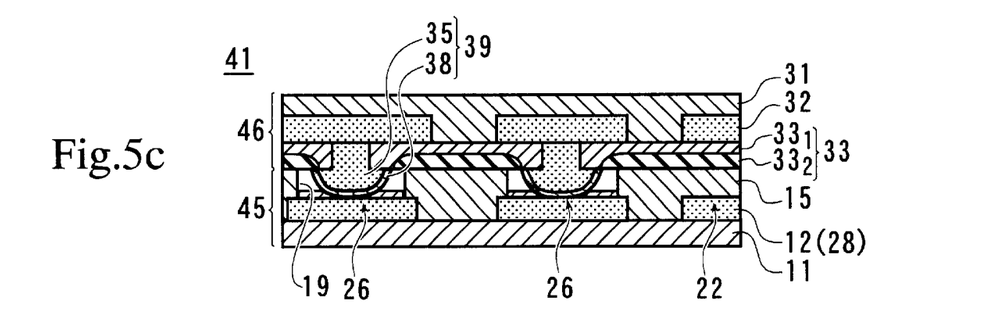

When said first and second flexible wiring boards 45, 46 are faced to each other and heated while the top of bump 39 is in contact with the top of contact pad 26 as shown in FIG. 5(b). Low-melting metal coating 27 on the surface of contact pad 26 melts, whereby contact pad 26 and bump 39 are connected. The surface of second resin film 33 is pressed against first resin film 15, and first flexible wiring board 45 and second flexible wiring board 46 are bonded together into a multilayer flexible wiring board 41, as shown in FIG. 5(c).

Next, an another example of the present invention is described. Although first flexible wiring boards 10, 45 in the foregoing examples have first resin film 15 on the edge of highly wetting metal coating 14 or low-melting metal coating 27 exposed at the bottom of contact pads 21, 26 and a wall member is formed of wall face 23 comprising part of first resin film 15 above the edge of contact pads 21, 26, the present invention is not limited to such a structure.

Figure 6:
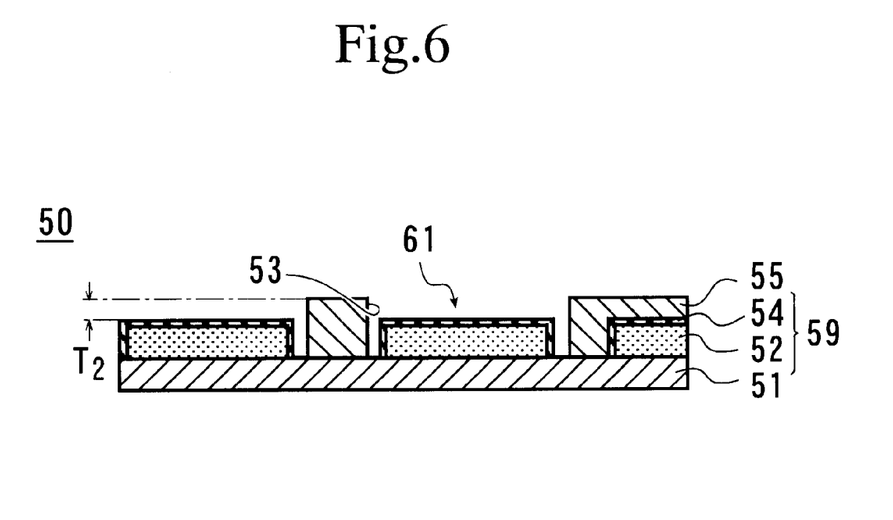
FIG. 6 shows another example of first flexible wiring board suitable for manufacturing a multilayer flexible wiring board according to the present invention.

For example, first flexible wiring board 50 shown in FIG. 6 has a first base film 51 and a first conductive film 52 including a patterned copper foil applied on its surface. A highly wetting metal film 54 such as gold is formed on the surface of this conductive film 52, so that a first wiring film 59 is formed of first conductive film 52 and highly wetting metal film 54.

A first resin film 55 is formed on first wiring film 59 and first base film 51, by forming a polyimide precursor layer and patterning said polyimide precursor layer and then curing said patterned polyimide precursor layer by heat treatment.

The reference 61 represents a contact pad formed of a wide part of first wiring film 59. As first resin film 55 is patterned, highly wetting metal film 54 on contact pad 61 is wholly exposed and the surface of first base film 51 in the vicinity of contact pad 61 is also partially exposed.

In this case, a wall member including first resin film 55 is provided around contact pad 61. The reference 53 represents a wall face of the wall member.

This wall face 53 is upright from the surface of first base film 51 beside contact pad 61.

The top of wall face 53 projects upward from the top of contact pad 61. The reference $T_2$ represents the height of wall face 53 from the top surface of contact pad 61.

Figure 7A:
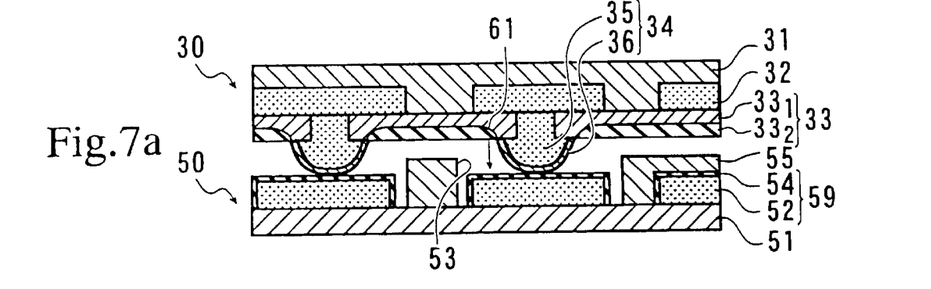
FIGS. 7(a),(b) shows a process for manufacturing a multilayer flexible wiring board according to the present invention using the first flexible wiring board shown in FIG. 6.

This height $T_2$ is smaller than the height H of bump 34 used for lamination. Bump 34 on second flexible wiring board 30 is contacted onto contact pad 61 (FIG. 7(a)).

Figure 7B:
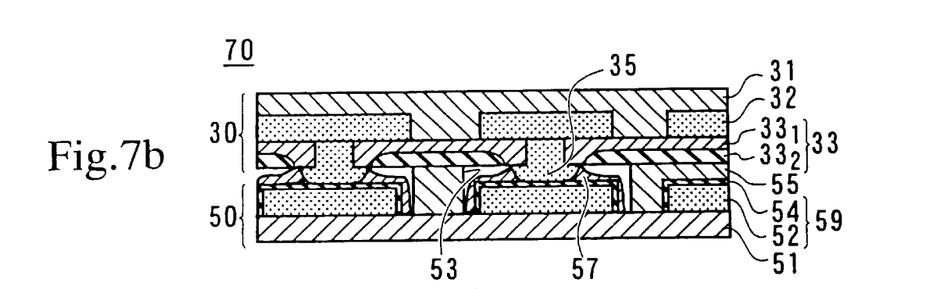

Then, low-melting metal coating 36 on the surface of bump 34 is heated under pressure to melt, the melt of low-melting metal coating 36 spreads over the surface of contact pad 61 (FIG. 7(b)). Even if the melt partially spills from the top of contact pad 61, it is stopped by wall face 53 so that any bridge cannot be formed between adjacent first wiring films 59 or between second wiring films 32.

Thus, low-melting metal coating 36 can be molten and then cooled to electrically connect contact pad 61 and metal projection 35 via solder metal 57 formed solidified melt of low-melting metal coating 36. As first and second flexible wiring boards 50, 30 are heated, adhesiveness is developed on the surface of second resin film 33 having thermoplasticity so that first and second flexible wiring boards 50, 30 are bonded together into a multilayer flexible wiring board 70 (FIG. 7(b)).

Although polyimide resins were used as materials for hermosetting resin film $33_1$ and thermoplastic resin film $33_2$ forming second resin film 33, the present invention is not limited to these materials. A wide range of resins having the property of developing adhesiveness upon heating and resisting decomposition during heating can be used as materials for thermoplastic resin films. They should desirably have chemical resistance and flame retardance.

Although second resin film 33 of second flexible wiring board 30, 46 has the property of developing adhesiveness upon heating in the foregoing examples, the present invention is not limited to such an embodiment. First resin film 15, 55 of first flexible wiring board 10, 45, 50 may have the property of developing adhesiveness upon heating. Alternatively, both resin films may have the property of developing adhesiveness upon heating.

Although a tin/zinc-based alloy was used as solder coating in the foregoing examples, the material for solder coating is not limited thereto, but other low-melting metals such as copper, nickel, copper-nickel alloys, and alloy based on tin and gold may also be used. When the low-melting metal is low wetting to a copper, it is possible to form highly wetting metal coating on the contact pads or the bumps to be bonded to the low-melting metal coating. Especially, metal coating based on gold is preferable for highly wetting metal coating. Low-melting metal coating can be formed by other techniques than plating such as screen printing.

When an alloy based on tin and gold is used as low-melting metal coating, it is unnecessary to contain lead to the alloy. Thus, lead-free multilayer flexible wiring board of the present invention can be manufactured.

When the low-melting metal coating is less wetting with copper, the highly wetting metal coating can be formed on the contact pad or bump to which the low-melting metal coating is applied. Particularly, the highly wetting metal coating is desirably a gold-based coating. The highly wetting metal coating can be formed by other techniques than plating such as vapor deposition or sputtering.

The melting point of the low-melting metal coating is desirably 170° C. or less. When the low-melting metal coating is formed of a metal or alloy having a relatively high melting point lower than said temperature, a multilayer flexible wiring board having a more excellent heat resistance can be formed.

According to the present invention, no short circuit occurs between copper wirings during lamination of a plurality of flexible wiring boards, whereby multilayer flexible wiring boards can be manufactured at increased yield and improved efficiency.

What is claimed is:

1. A multilayer flexible wiring board comprising laminated first and second flexible wiring boards, said first flexible wiring board comprising a first base film, a first wiring film having a first conductive film applied on said first base film and patterned, a contact pad including a part of said first wiring film exposed at a surface, and a non-conductive wall member provided around said contact pad and rising above a top of said contact pad, and said second flexible wiring board comprising a second base film, a second wiring film having a second conductive film applied on said second base film and patterned, and a plurality of bumps connected to said second wiring film, each bump having a top with a surface and exposed at the top, wherein a low-melting metal coating is formed on either of the surface of the part of said first conductive film forming said contact pad or the surface of at least the top of said bump, and said low-melting metal coating melts under heat and then solidifies to connect said contact pad and said bump.

2. The multilayer flexible wiring board according to claim 1 wherein said low-melting metal is an alloy based on lead and tin.

3. The multilayer flexible wiring board according to claim 1 wherein said low-melting metal is an alloy based on tin and gold but not containing lead.

4. The multilayer flexible wiring board according to claim 1 wherein a highly wetting metal coating including a metal or alloy being wetter than copper with said low-melting metal coating is formed on the surface of the part of said first wiring film forming said contact pad or the surface of at least the top of said bump on which said low-melting metal coating is not formed.

5. The multilayer flexible wiring board according to claim 4 wherein said highly wetting metal coating is any of a gold coating based on gold, a platinum coating based on platinum, a silver coating based on silver, a nickel coating based on nickel, a copper-nickel alloy coating or a solder coating.

6. The multilayer flexible wiring board according to claim 1 wherein the height of said wall member above the top of said contact pad is 5 µm or more.

7. The multilayer flexible wiring board according to claim 1 wherein a first resin film is provided on said first wiring film and an opening is provided in said first resin film at the top of said contact pad so that said wall member includes said first resin film forming the inner circumferential face of said opening.

8. The multilayer flexible wiring board according to claim 7 wherein said first resin film has the property of developing adhesiveness upon heating so that said first flexible wiring board and said second flexible wiring board are bonded together via said first resin film.

9. The multilayer flexible wiring board according to claim 7 wherein said opening has such a volume that said low-melting metal coating does not overflow outside said opening when said low-melting metal coating is molten while said bump is in contact with said contact pad.

10. The multilayer flexible wiring board according to claim 7 wherein said bump comes into contact with said contact pad without touching said wall member.

11. The multilayer flexible wiring board according to claim 7 wherein the height of the projecting part of said bump is larger than the height of said wall member from the top of said contact pad.

12. The multilayer flexible wiring board according to claim 1 wherein said second flexible wiring board has a second resin film provided on at least said second wiring film and the top of said bump projects from said second resin film.

13. The multilayer flexible wiring board according to claim 12 wherein said second resin film has the property of developing adhesiveness upon heating so that said first flexible wiring board and said second flexible wiring board are bonded together via said second resin film.

* * * * *